(12) United States Patent
Lin

(10) Patent No.: US 7,372,707 B2
(45) Date of Patent: May 13, 2008

(54) POSITIONING MEMBER FOR CIRCUIT BOARD AND CIRCUIT BOARD POSITIONING MECHANISM HAVING THE POSITIONING MEMBER

(75) Inventor: Linger Lin, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/522,264

(22) Filed: Sep. 14, 2006

(65) Prior Publication Data
US 2008/0019109 A1 Jan. 24, 2008

(51) Int. Cl.
*H05K 7/02* (2006.01)
(52) U.S. Cl. ...................... 361/807; 361/810
(58) Field of Classification Search ............... 361/807, 361/810, 760; 174/138 D, 138 G
See application file for complete search history.

(56) References Cited

U.S. PATENT DOCUMENTS

| 5,838,538 | A | * | 11/1998 | Yee | 361/683 |
| 6,122,176 | A | * | 9/2000 | Clements | 361/752 |
| 6,385,050 | B1 | * | 5/2002 | Orita et al. | 361/759 |
| 6,693,799 | B2 | * | 2/2004 | Gough et al. | 361/758 |
| 7,151,677 | B2 | * | 12/2006 | Le et al. | 361/807 |

* cited by examiner

*Primary Examiner*—Tuan T. Dinh
*Assistant Examiner*—Yuriy Semenenko
(74) *Attorney, Agent, or Firm*—Peter F. Corless; Steven M. Jensen; Edwards Angell Palmer & Dodge LLP

(57) ABSTRACT

The invention provides a positioning member for a circuit board and a circuit board positioning mechanism having the positioning member, which is adapted to limit the latitude of a first direction of the printed circuit board installed on a housing. The circuit board positioning mechanism includes a plurality of first connecting portions disposed on the housing and a positioning member, wherein the positioning member consists of a body, a second connecting portion disposed on the body for movably connecting with the first connecting portions, and a propping portion disposed on one side of the body for propping against the circuit board when the body moves along a second direction, thereby further restricting the latitude of the circuit board in a first direction so as to prevent detachment of the circuit board caused by external force and also to assemble and disassemble the circuit board without having to use a tool.

15 Claims, 6 Drawing Sheets

POSITIONING MEMBER FOR CIRCUIT BOARD AND CIRCUIT BOARD POSITIONING MECHANISM HAVING THE POSITIONING MEMBER

BACKGROUND OF THE INVENTION

1. Field of the Invention:

The present invention relates generally to circuit board positioning mechanisms, and more particularly to a positioning mechanism having a positioning member for positioning a circuit board to a housing.

2. Description of Related Art:

Currently, circuit boards play an important role in various kinds of electronic products such as servers and personal computers. How to efficiently position a circuit board to a housing without increasing the cost is especially important.

FIG. 1 shows a conventional circuit board positioning mechanism. Disposed on a circuit board 11 are a plurality of positioning holes 110, which correspond to a plurality of positioning columns 10 disposed on a housing 1. The circuit board 11 is mounted to the housing 1 with the positioning columns 10 penetrating through the positioning holes 110. A stopping board 12 is disposed on the housing 1 at one side of the circuit board 11 for preventing the circuit board 1 from moving forward and backward. The stopping board 12 is fixed to the housing 1 by a screw 13.

However, the use of the stopping board 12 increases the cost and tools are needed to assemble or disassemble the circuit board 11 since the stopping board 12 is screw fixed.

SUMMARY OF THE INVENTION

According to the above drawbacks, an objective of the present invention is to provide a positioning member and a circuit board positioning mechanism having the positioning member through which a circuit board can easily be assembled or disassembled without the need of any tools.

Another objective of the present invention is to provide a positioning member and a circuit board positioning mechanism having the positioning member which can prevent the circuit board from loosening caused by external shaking.

A further objective of the present invention is to provide a positioning member and a circuit board positioning mechanism having the positioning member which have simple structure and reduced cost.

In order to attain the above and other objectives, a circuit board positioning mechanism for limiting the latitude of a first direction of a circuit board installed on a housing is proposed, which comprises: a plurality of first connecting portions disposed on the housing; and a positioning member, wherein, the positioning member comprises a body, a second connecting portion disposed on the body and movably connected with the first connecting portions, and a propping portion disposed at one side of the body for propping against the circuit board when the body moves along a second direction, thereby restricting the latitude of the circuit board in a first direction so as to position the circuit board on the housing.

In one embodiment, the positioning member is connected with two parallel first connecting portions. Each of the first connecting portions comprises a column body and an umbrella head portion formed on the top of the column body, and diameter of the umbrella head portion is bigger than that of the column body. The second connecting portion is a slot, width of which corresponds to the diameter of the column body.

The propping portion protrudes from the body and may further comprise an opening portion connected with the slot of the second connecting portion. One of the first connecting portions penetrates through the opening portion and the other first connecting portion penetrates through a predefined position of the second connecting portion.

The diameter of the opening portion is bigger than the width of the slot of the second connecting portion. The slot of the second connecting portion further includes an opening formed at the predefined position through which the other first connecting portion penetrates, and the diameter of the opening is bigger than the width of the slot.

Elastic position limiting arms may further be disposed at opposite sides of the opening portion with back end of the elastic position limiting arms extending to a position where the opening portion connects with the second connecting portion.

A clipping portion may be disposed at the end of the propping portion for clipping the circuit board.

The body of the positioning member is elastic and elongated, and the second connecting portion of the positioning member corresponds in shape to the body.

The present invention also proposes a positioning member for positioning a circuit board on a housing, wherein a plurality of first connecting portions is disposed on the housing and the circuit board is movable in a first direction. The positioning member comprises: a body; a second connecting portion disposed on the body and movably connected with the first connecting portions; and a propping portion disposed at one side of the body for propping against the circuit board when the body moves along a second direction, thereby restricting the latitude of the circuit board in a first direction so as to position the circuit board on the housing.

Through the present invention, the first connecting portions disposed on the housing are connected with the second connecting portion of the positioning member, and then the positioning member is moved in the second direction until the positioning member reaches a certain position so as to make the propping portion of the positioning member prop against the circuit board, thereby limiting the latitude of the first direction of the circuit board. As a result, the circuit board can easily be mounted to or detached from the housing without the need of any tools. Through the present invention, the circuit board is positioned and prevented from loosening caused by shaking. In addition, the positioning member and the positioning mechanism of the present invention have simple structure and can be fabricated at a low cost.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

Figure 1:
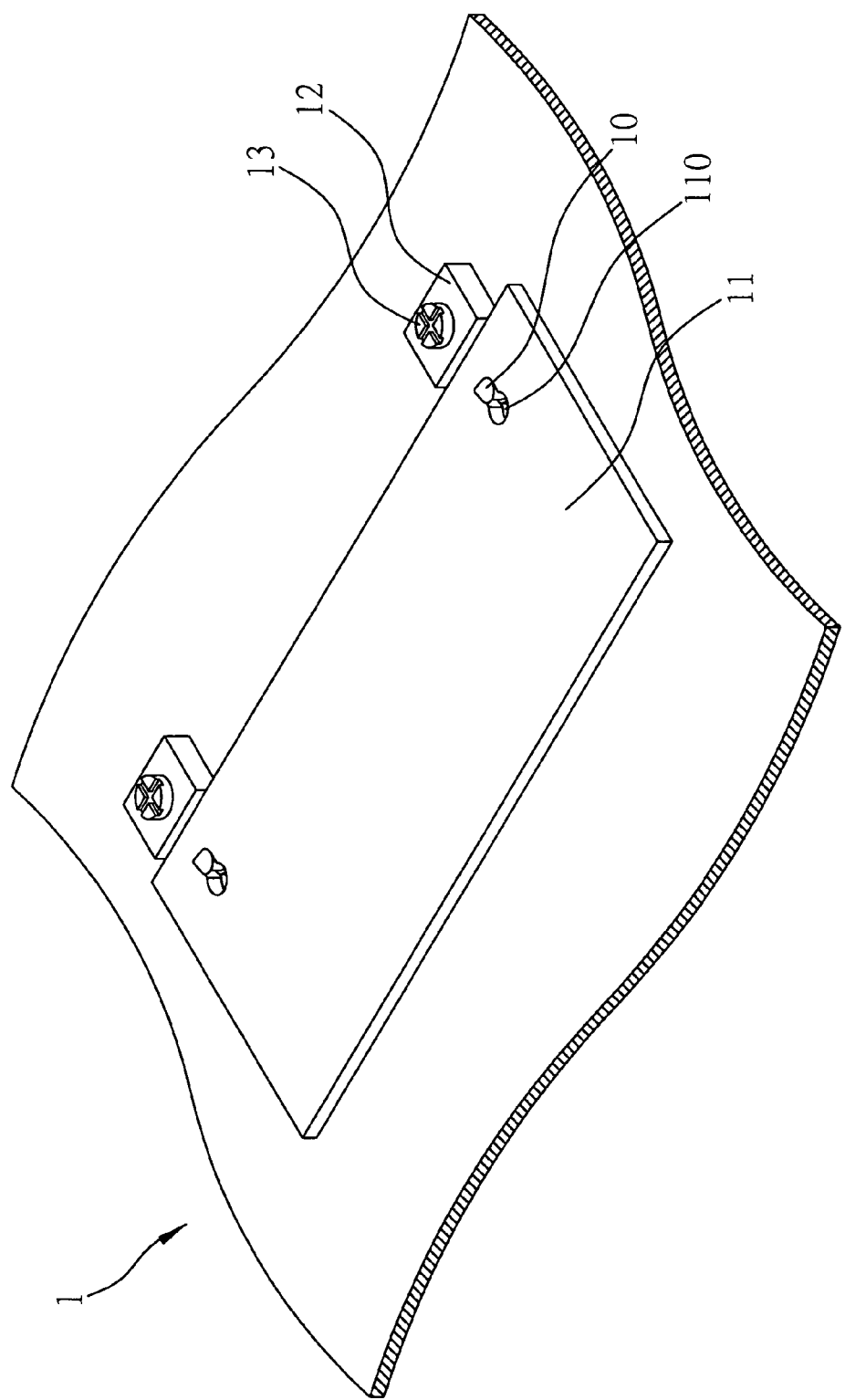
FIG. 1 is a structural diagram of a conventional circuit board positioning mechanism.
Figure 2:
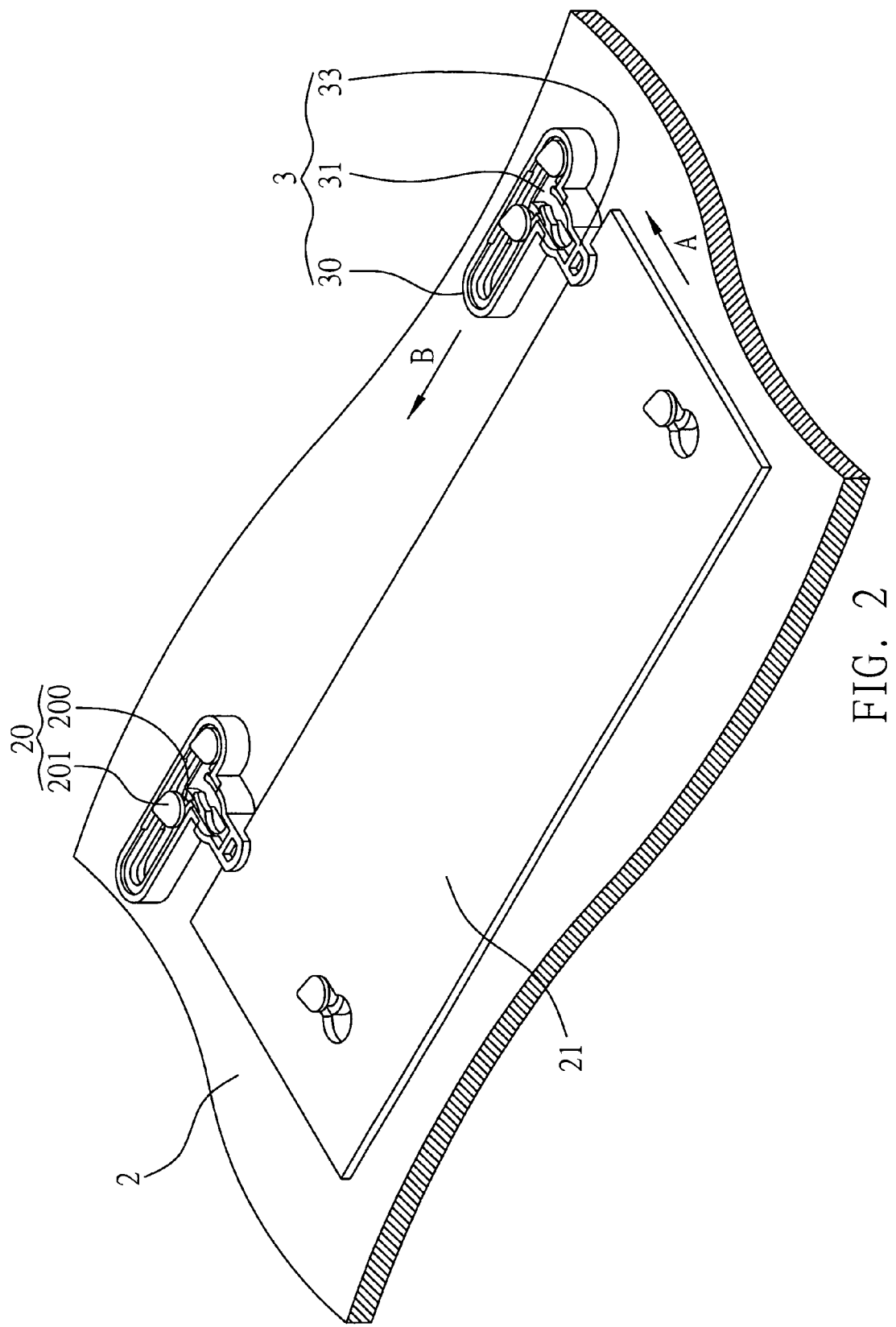
FIG. 2 is a structural diagram of a circuit board positioning mechanism according to the present invention.

FIG. 2 is a structural diagram showing a circuit board positioning mechanism of the present invention. As shown in FIG. 2, a circuit board 21 is disposed on a housing 2 and movable in a first direction A. The circuit board positioning mechanism of the present invention comprises a plurality of first connecting portions 20 disposed on the housing 2 and a positioning member 3 that can be movably connected with the first connecting portions 20. The circuit board positioning mechanism is used to limit the latitude of the first direction A of the circuit board 21 so as to position the circuit board 21 on the housing 2 by making the positioning member 3 prop against the circuit board 21.

The positioning member 3 comprises a body 30, a second connecting portion 31 disposed on the body 30 and movably connected with the first connecting portions 20, and a propping portion 33 disposed on one side of the body 30 for propping against the circuit board 21 so as to limit the latitude of the first direction A of the circuit board 21.

Each of the first connecting portions 20 comprises a column body 200 and an umbrella head portion 201 disposed on the top of the column body 200. Diameter of the umbrella head portion 201 is bigger than that of the column body 200.

The body 30 of the positioning member 3 is elastic and elongated. The second connection portion 31 is an elongated slot, width of which corresponds to the diameter of the column body 200 of the first connecting portion 20. In addition, the positioning member 3 can be movably connected to two parallel first connection portions 20 such that the positioning member 3 can move in a second direction B perpendicular to the first direction A.

The propping portion 33 of the positioning member 3 protrudes from the body 30. After the first connecting portions 20 are connected with the second connecting portion 31, the positioning member 3 is moved in the second direction B so as to make the propping portion 33 prop against the circuit board 1, thereby limiting the latitude of the first direction A of the circuit board 21.

Figure 3:
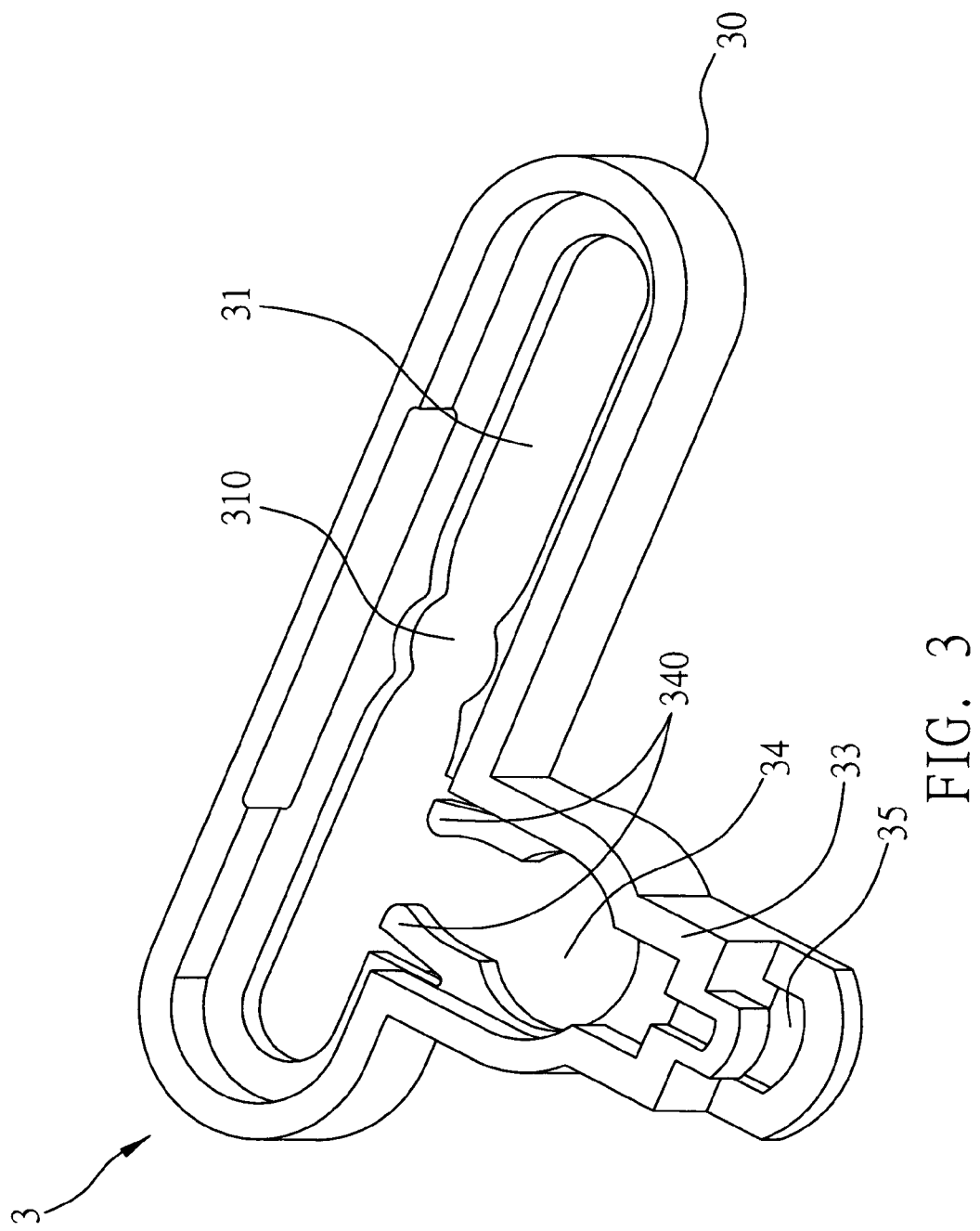
FIG. 3 is a diagram of a positioning member for a circuit board according to the present invention.

Referring to FIG. 3, the propping portion 33 has a clipping portion 35 formed at the end thereof for clipping the circuit board 21, thereby strengthening the stability of the propping effort of the propping portion 33. An opening portion 34 is further formed in the propping portion 33 and connected with the elongated slot of the second connecting portion 31. The diameter of the opening portion 34 is slightly bigger than the width of the second connecting portion 31. One of the first connecting portions 20 can easily be penetrated through the opening portion 34, and the other first connecting portion 20 can be penetrated through the second connecting portion 31 of the positioning member 3 through the deformation of the body 30. When the two first connecting portions 20 are respectively connected with the opening portion 34 and the second connecting portion 31, the positioning member 3 is rotated such that both the two first connecting portions 20 are connected to the second connecting portion 20. To facilitate the connection between the positioning member 3 and the first connecting portions 20, a connecting opening 310 can further be formed at a predefined position of the second connecting portion 31 where the first connecting portion 20 is to be connected, wherein the diameter of the connecting opening 310 is slightly bigger than the width of the elongated slot of the second connecting portion 31. In addition, to prevent the first connecting portion 20 from sliding back to the opening portion 34 when the positioning member 3 is moved in the second direction B, elastic position limiting arms 340 are disposed at two opposite sides of the opening portion 34, and back end of the elastic position limiting arms 340 extends to a position where the opening portion 34 connects with the second connecting portion 31.

Figure 4A:
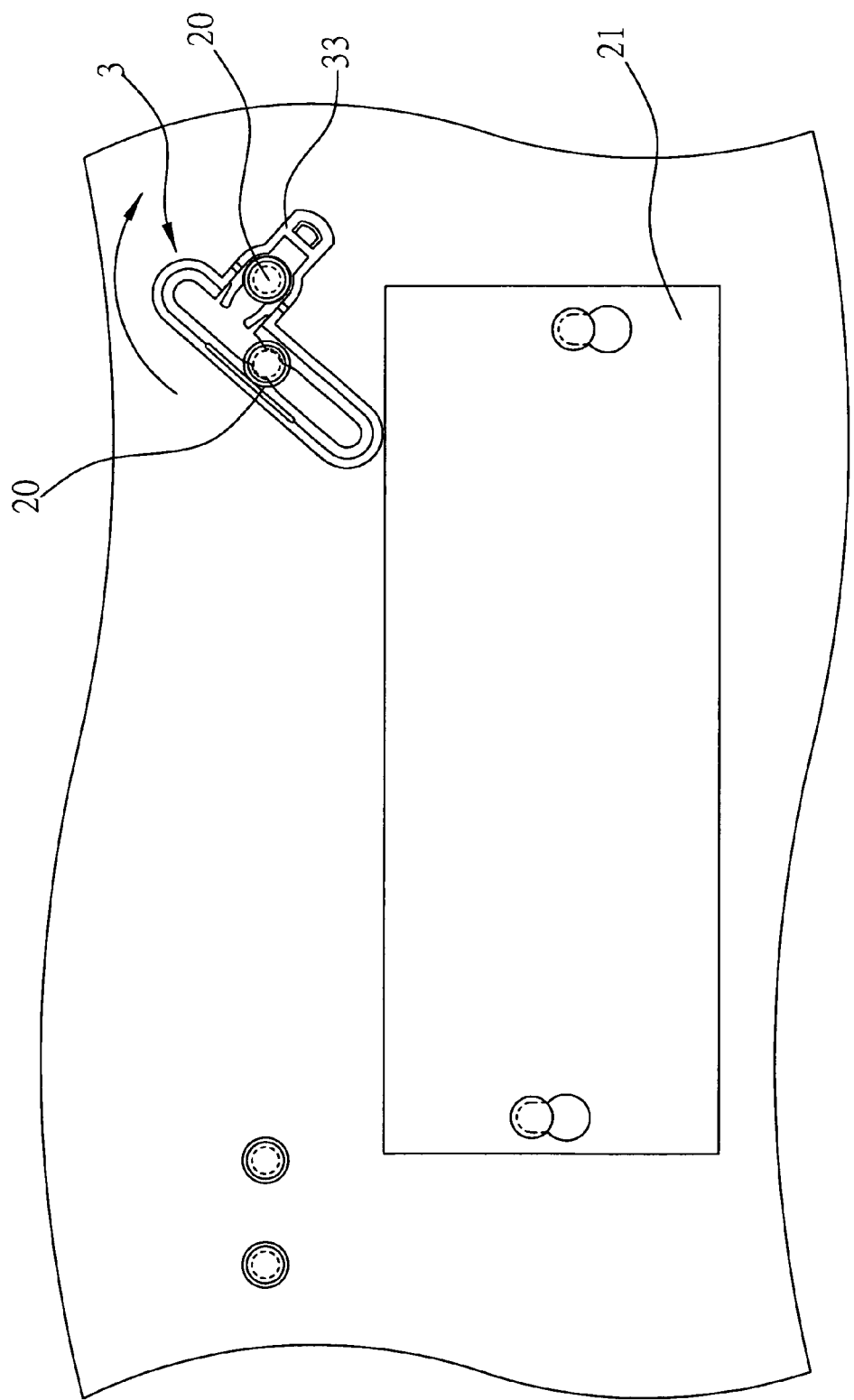
FIGS. 4A to 4C are diagrams showing operation of the circuit board positioning mechanism according to the present invention.
Figure 4B:
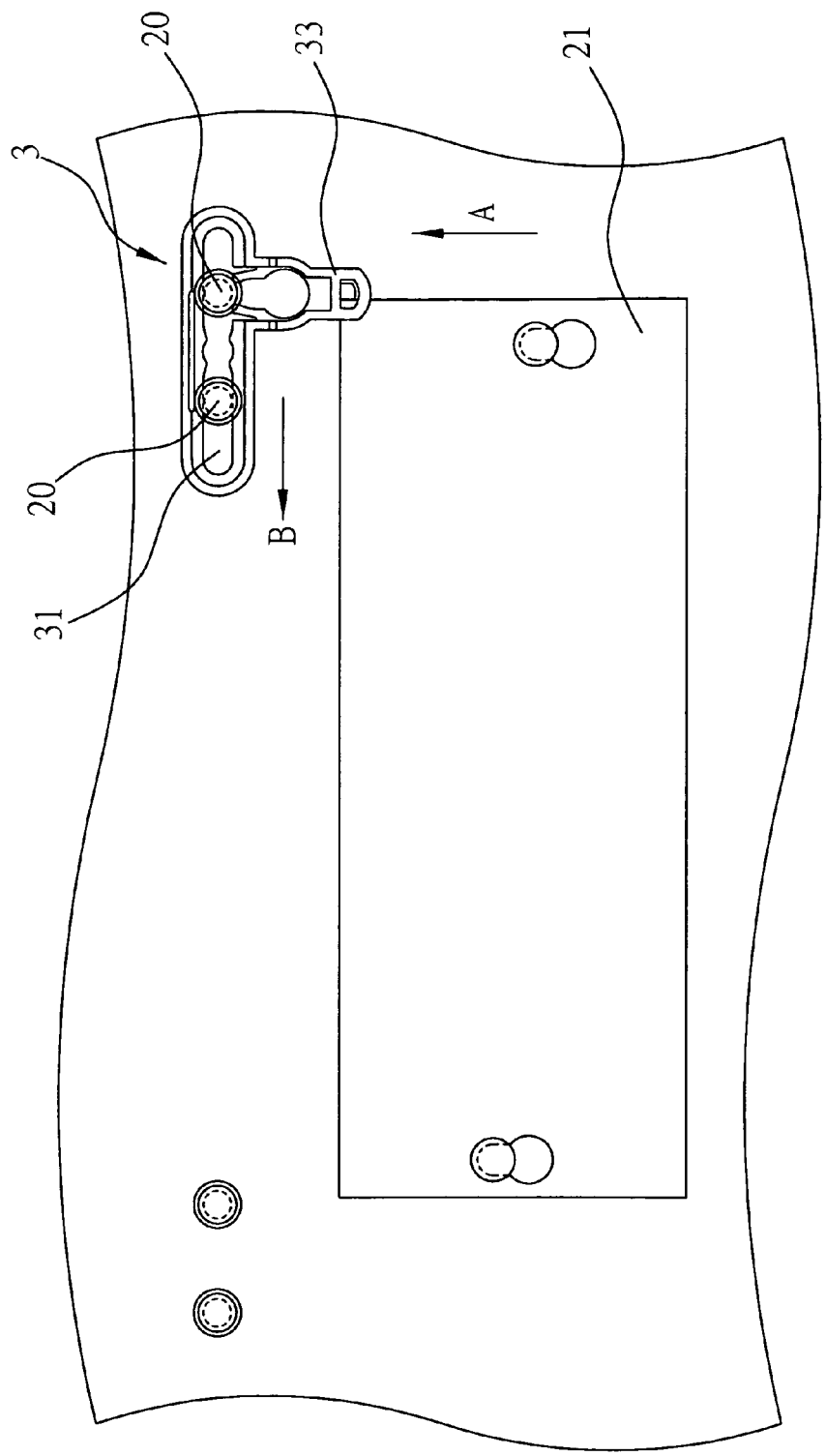
Figure 4C:
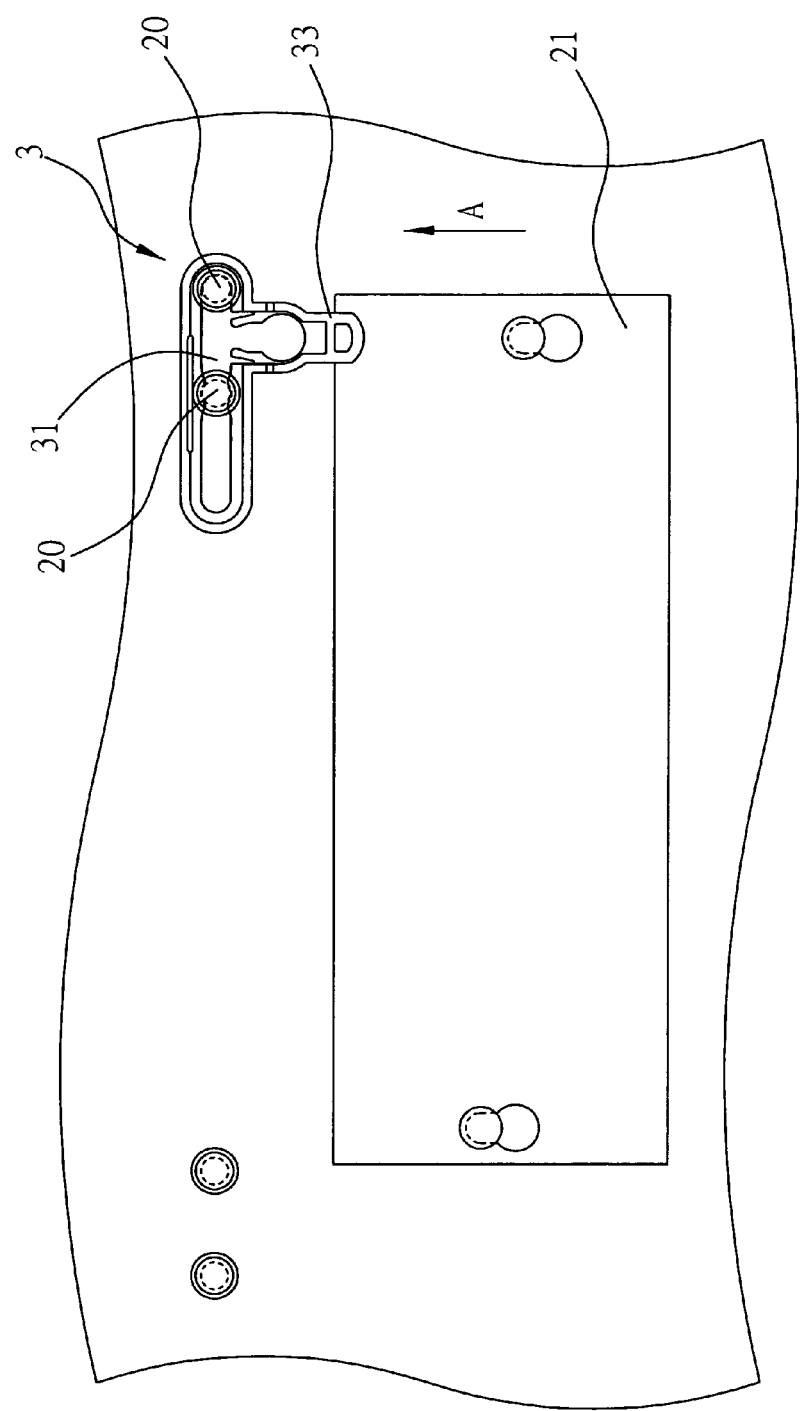

FIGS. 4A and 4C show the operation of the circuit board positioning mechanism of the present invention. As shown in FIG. 4A, the positioning member 3 is connected to the first connecting portions 20 with the opening portion 34 connected with one of the first connecting portions 20 and the second connecting portion 31 connected with the other first connecting portion 20. Then, by rotating the positioning member 3, both the two parallel first connecting portions 20 are connected with the second positioning portion 3, as shown in FIG. 4B. Thereafter, the positioning member 3 is moved in the second direction B so as to make the propping portion 33 prop against the circuit board 21. As shown in FIG. 4C, when one of the first connecting portions 20 is stopped by one end of the second connecting portion 31, the propping portion 33 reaches the predefined position for propping against the circuit board 21. By performing a reverse operation, the positioning member 3 can easily be detached from the first connecting portions 20.

Therefore, the circuit board positioning mechanism of the present invention mainly connects together the first connecting portions disposed on the housing and the second connecting portion of the positioning member, and then moves the positioning member in the second direction until the positioning member reaches a certain position so as to make the propping portion of the positioning member prop against the circuit board, thereby limiting the latitude of the first direction of the circuit board. As a result, the circuit board can easily be mounted to or detached from the housing without the need of any tools. Through the present invention, the circuit board is positioned and prevented from loosening caused by shaking. In addition, the positioning member and the positioning mechanism of the present invention have simple structure and can be fabricated at a low cost.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A circuit board positioning mechanism, which is applicable to a circuit board installed on a housing and movable in a first direction, the circuit board position mechanism comprising:

a plurality of first connecting portions disposed on the housing; and a positioning member, which comprises a body, a second connecting portion disposed on the body and movably connected with the first connecting portions, and a propping portion disposed at one side of the body for propping against the circuit board when the body moves in a second direction perpendicular to the first direction, thereby restricting the circuit board to move in the first direction so as to position the circuit board on the housing, wherein each of the first connecting portions comprises a column body and an umbrella head portion formed on top of the column body, the umbrella head portion having an outer diameter larger than that of the column body, and the second connecting portion is a slot having a width corresponding to the outer diameter of the column body, and wherein the propping portion protrudes from the body and comprises an opening portion connected with the slot of the second connecting portion.

2. The circuit board positioning mechanism of claim 1, wherein the positioning member is connected with two parallel first connecting portions.

3. The circuit board positioning mechanism of claim 2, wherein one of the first connecting portions penetrating through the opening portion and the other first connecting portion penetrating through a predefined position of the second connecting portion.

4. The circuit board positioning mechanism of claim 3, wherein the opening portion has a diameter larger than the width of the slot of the second connecting portion, and the slot of the second connecting portion has an opening formed at the predefined position through which the other first connecting portion penetrates, the opening having a diameter larger than the width of the slot.

5. The circuit board positioning mechanism of claim 4 further comprising a plurality of elastic position limiting arms disposed at opposite sides of the opening portion with back end of the elastic position limiting arms extending to a position where the opening portion connects with the second connecting portion.

6. The circuit board positioning mechanism of claim 3 further comprising a clipping portion disposed at an end of the propping portion for clipping the circuit board.

7. The circuit board positioning mechanism of claim 1, wherein the body of the positioning member is elastic and elongated, and the second connecting portion of the positioning member corresponds in shape to the body.

8. A positioning member for positioning a circuit board movable in a first direction on a housing having a plurality of first connecting portions, the positioning member comprising:
   a body;
   a second connecting portion disposed on the body and movably connected with the first connecting portions; and
   a propping portion disposed at one side of the body for propping against the circuit board when the body moves along a second direction, thereby restricting the circuit board to move in the first direction so as to position the circuit board on the housing, wherein each of the first connecting portions comprises a column body and an umbrella head portion formed on top of the column body, the umbrella head portion having an outer diameter larger than that of the column body, and the second connecting portion is a slot having a width corresponding to the outer diameter of the column body, and wherein the propping portion protrudes from the body and comprises an opening portion connected with the slot of the second connecting portion.

9. The positioning member of claim 8, wherein the positioning member is connected with two parallel first connecting portions.

10. The positioning member of claim 9, wherein one of the first connecting portions penetrating through the opening portion and the other first connecting portion penetrating through a predefined position of the second connecting portion.

11. The positioning member of claim 10 further comprising a clipping portion disposed at an end of the propping portion for clipping the circuit board.

12. The positioning member of claim 10, wherein the diameter of the opening portion is bigger than the width of the slot of the second connecting portion, and the slot of the second connecting portion has an opening formed at the predefined position through which the other first connecting portion penetrates, the diameter of the opening is bigger than the width of the slot.

13. The positioning member of claim 12, wherein elastic position limiting arms are disposed at opposite sides of the opening portion with back end of the elastic position limiting arms extending to a position where the opening portion connects with the second connecting portion.

14. The positioning member of claim 11 further comprising a plurality of elastic position limiting arms disposed at opposite sides of the opening portion with back end of the elastic position limiting arms extending to a position where the opening portion connects with the second connecting portion.

15. The positioning member of claim 8, wherein the body of the positioning member is elastic and elongated, and the second connecting portion of the positioning member corresponds in shape to the body.

* * * * *